(12) United States Patent
Bean et al.

(10) Patent No.: US 11,502,060 B2
(45) Date of Patent: Nov. 15, 2022

(54) MICROELECTRONICS PACKAGE WITH ENHANCED THERMAL DISSIPATION

(71) Applicant: Rockwell Collins, Inc., Cedar Rapids, IA (US)

(72) Inventors: Reginald D. Bean, Center Point, IA (US); Bret W. Simon, West Liberty, IA (US); Russell C. Tawney, Cedar Rapids, IA (US); Ross K. Wilcoxon, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/953,988

(22) Filed: Nov. 20, 2020

(65) Prior Publication Data
US 2022/0165705 A1     May 26, 2022

(51) Int. Cl.
| | |
|---|---|
| *H01L 25/065* | (2006.01) |
| *H01L 23/13* | (2006.01) |
| *H01L 23/367* | (2006.01) |
| *H01L 23/538* | (2006.01) |
| *H01L 23/552* | (2006.01) |

(52) U.S. Cl.
CPC .......... *H01L 25/0652* (2013.01); *H01L 23/13* (2013.01); *H01L 23/367* (2013.01); *H01L 23/5385* (2013.01); *H01L 23/5389* (2013.01); *H01L 23/552* (2013.01)

(58) Field of Classification Search
None
See application file for complete search history.

(56) References Cited

U.S. PATENT DOCUMENTS

| | | |
|---|---|---|
| 6,798,057 B2 | 9/2004 | Bolkin et al. |
| 7,638,866 B1 | 12/2009 | Bean et al. |
| 8,361,837 B2 | 1/2013 | Cui et al. |
| 8,865,521 B2 | 10/2014 | Jeng et al. |
| 9,793,191 B2 | 10/2017 | Refai-Ahmed |
| 10,014,283 B1 | 7/2018 | Chiang et al. |
| 10,115,653 B2 | 10/2018 | Lin |
| 10,134,711 B2 | 11/2018 | Lin et al. |

(Continued)

FOREIGN PATENT DOCUMENTS

| | | |
|---|---|---|
| TW | I525787 B | 3/2016 |
| WO | 2020202789 A1 | 10/2020 |

OTHER PUBLICATIONS

Extended Search Report in European Application No. 21208000.6 dated Apr. 14, 2022, 7 pages.

*Primary Examiner* — Long Pham
(74) *Attorney, Agent, or Firm* — Suiter Swantz pc llo (57) ABSTRACT

A semiconductor package system is disclosed. The system includes a first interposer and a first integrated circuit die electrically coupled and thermally coupled to a first side of the first interposer. The system further includes a second integrated circuit die electrically coupled and thermally coupled to a second side of the first interposer. The system further includes a ring carrier electrically coupled and thermally coupled to the first interposer. The ring carrier is configured to transmit an input to the first interposer. In some embodiments, the system further includes at least one thermal spreader thermally coupled to the ring carrier and at least one of the first integrated circuit, the second integrated circuit, or the first interposer.

12 Claims, 6 Drawing Sheets

(56) References Cited

U.S. PATENT DOCUMENTS

| | | |
|---|---|---|
| 10,141,239 B2 | 11/2018 | Lin |
| 10,446,520 B2 * | 10/2019 | Jeng ........................ H01L 24/97 |
| 10,720,417 B2 | 7/2020 | Scanlan |
| 2014/0217610 A1 | 8/2014 | Jeng et al. |
| 2020/0098724 A1 | 3/2020 | Liff et al. |
| 2020/0105544 A1 | 4/2020 | Tsai et al. |
| 2020/0111720 A1 | 4/2020 | Wan et al. |
| 2020/0144170 A1 | 5/2020 | Yazdani |

\* cited by examiner

MICROELECTRONICS PACKAGE WITH ENHANCED THERMAL DISSIPATION

BACKGROUND

As the sizes of microelectronic componentry are continually being reduced, logic densities have been increased to accommodate the growing need for higher and higher processing performance. This increase in logic density has resulted in an increase in volumetric power dissipation. Increased power consumption (or power density) translates to the need to establish lower thermal resistance paths between the processing components that are high in power density to one or more external package surfaces. In a packaged device, such as a microprocessor, heat is transferred from the microprocessor die to the package lid, which is typically in thermal contact with an external heat removal device such as a heat pipe or heat sink.

One strategy for increasing logic density is the use of multi-chip modules (MCM), which can achieve high logic density in a unit space. Within MCMs, there is a significant trend towards stacking integrated circuit die in which multiple dice are physically located in the same horizontal location but vertically separated on different horizontal planes. In this manner, the dice are attached to substrates such that they are electrically connected through the substrates and to one or more dice on other substrates through vertical interconnections between the substrates, a strategy often referred to as 2.5D packaging. This stacking particularly introduces thermal management challenges to the package since internal dice are not directly accessible, but instead must conduct dissipated power out to the perimeter of the device. In addition, there is a need to provide a package that allows for low thermal resistance conduction in any orientation. For example, a package consisting of a thermal lid on the top side that can be attached to a set of fins may not perform efficiently in applications that have insufficient space for a heat sink on top of the component, thereby increasing the need for good heat transfer to the base of the package. Thus, it is desirable to provide a system or method that avoids the shortcomings of conventional approaches.

SUMMARY

A semiconductor package system is disclosed. In one or more embodiments, the system includes a first interposer. In some embodiments, the system further includes a first integrated circuit die electrically coupled and thermally coupled to a first side of the first interposer. In some embodiments, the system further includes a second integrated circuit die electrically coupled and thermally coupled to a second side of the first interposer. In some embodiments, the system further includes a ring carrier electrically coupled and thermally coupled to the first interposer. In some embodiments, the ring carrier is configured to transmit an electrical input to the first interposer. In some embodiments, the system further includes at least one thermal spreader thermally coupled to the ring carrier and at least one of the first integrated circuit, the second integrated circuit, or the first interposer.

In some embodiments of the system, the system further includes a package substrate electrically coupled to the ring carrier.

In some embodiments of the system, the system further includes a second interposer electrically coupled and thermally coupled to the ring carrier.

In some embodiments of the system, the system further includes a thermal interface disposed between the thermal spreader and at least one of the first integrated circuit or the second integrated circuit.

In some embodiments of the system, the thermal spreader further comprises a thermal layer and a top lid.

In some embodiments of the system, the thermal spreader is configured as a base thermal spreader, wherein the base thermal spreader is thermally coupled to the package substrate.

In some embodiments of the system, the thermal spreader is configured as a top thermal spreader.

In some embodiments of the system, the thermal spreader comprises at least one of an electromagnetic shielding material, an electromagnetic shielding property, a thermally conductive material, a thermally conductive property, an optically transparent material, an optically transparent property, a thermal expansion material, a thermal expansion property, or a polymorphic material.

In some embodiments of the system, the thermal spreader includes at least two spreader layers, wherein a first spreader layer of the thermal spreader includes at least one of an electromagnetic shielding material, a thermally conductive material, a thermal expansion material, or a polymorphic material, wherein the thermal spreader comprises at least one of an electromagnetic shielding characteristic, a thermally conductive characteristic, a thermal expansion characteristic, a mechanical characteristic, or an optical characteristic that is substantially different than at least one of the electromagnetic shielding characteristic, the thermally conductive characteristic, the thermal expansion characteristic, the mechanical characteristic, or the optical characteristic of the first spreader layer.

In some embodiments of the system, the system further comprises an external heat removal module thermally coupled to the thermal spreader.

In some embodiments of the system, the position of the ring carrier creates one or more cavities within the system that provide at least one of clearance for components on the first surface or the second surface of the interposer or the thermal spreader.

A method for manufacturing a semiconductor package is also disclosed. In some embodiments of the method, the method includes forming a base substrate. In some embodiments of the method, the method includes mounting a first integrated circuit to the base substrate. In some embodiments of the method, the method includes mounting an interposer on a first side to the first integrated circuit die and the ring carrier. In some embodiments of the method, the interposer is thermally coupled and electrically coupled to the first integrated circuit die and the ring carrier. In some embodiments of the method, the method includes mounting a second integrated circuit die on a second side of the interposer, wherein the second integrated circuit die is thermally coupled and electrically coupled to the second side of the interposer. In some embodiments of the method, the method includes mounting a top thermal spreader onto the second integrated circuit die, wherein the top thermal spreader is thermally coupled to the second integrated circuit die and the ring carrier.

In some embodiments of the method, the base substrate includes a base thermal spreader.

In some embodiments of the method, the method further includes adding a thermal interface between the first integrated circuit die and the base thermal spreader.

In some embodiments, the method further includes adding a thermal interface between the second integrated circuit die and the top thermal spreader.

In some embodiments of the method, at least one of the top thermal spreader or the base thermal spreader comprises a thermal layer and a lid.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Before explaining one or more embodiments of the disclosure in detail, it is to be understood that the embodiments are a limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

A package for an integrated circuit die is disclosed. In particular a package for a multi-chip module (MCM) is disclosed that provides thermal conductivity and/or shielding to both the top and bottom surfaces of one or more dice within the MCM. The packaging provides thermal control for high density MCMs and protects the dice within the MCM from radiation and/or other electromagnetic phenomena that may lead to damage such as neutron induced logic upset. Multiple semiconductor chips are electrically coupled and thermally coupled to an interposer, which is also electrically coupled and thermally coupled to a ring carrier. The ring carrier is novel in that the ring carrier provides an electrical input/output linkage to the interposer while providing a thermal path to the bottom of the package. The ring carrier also couples the package to a substrate, such as a circuit board. The package provides fine pitch geometries for the semiconductor chips while providing moderate host interface pitches typical of commercial off-the-shelf devices that are mounted to printed circuit boards (PCB) or printed wiring boards (PWB).

Figure 1A:
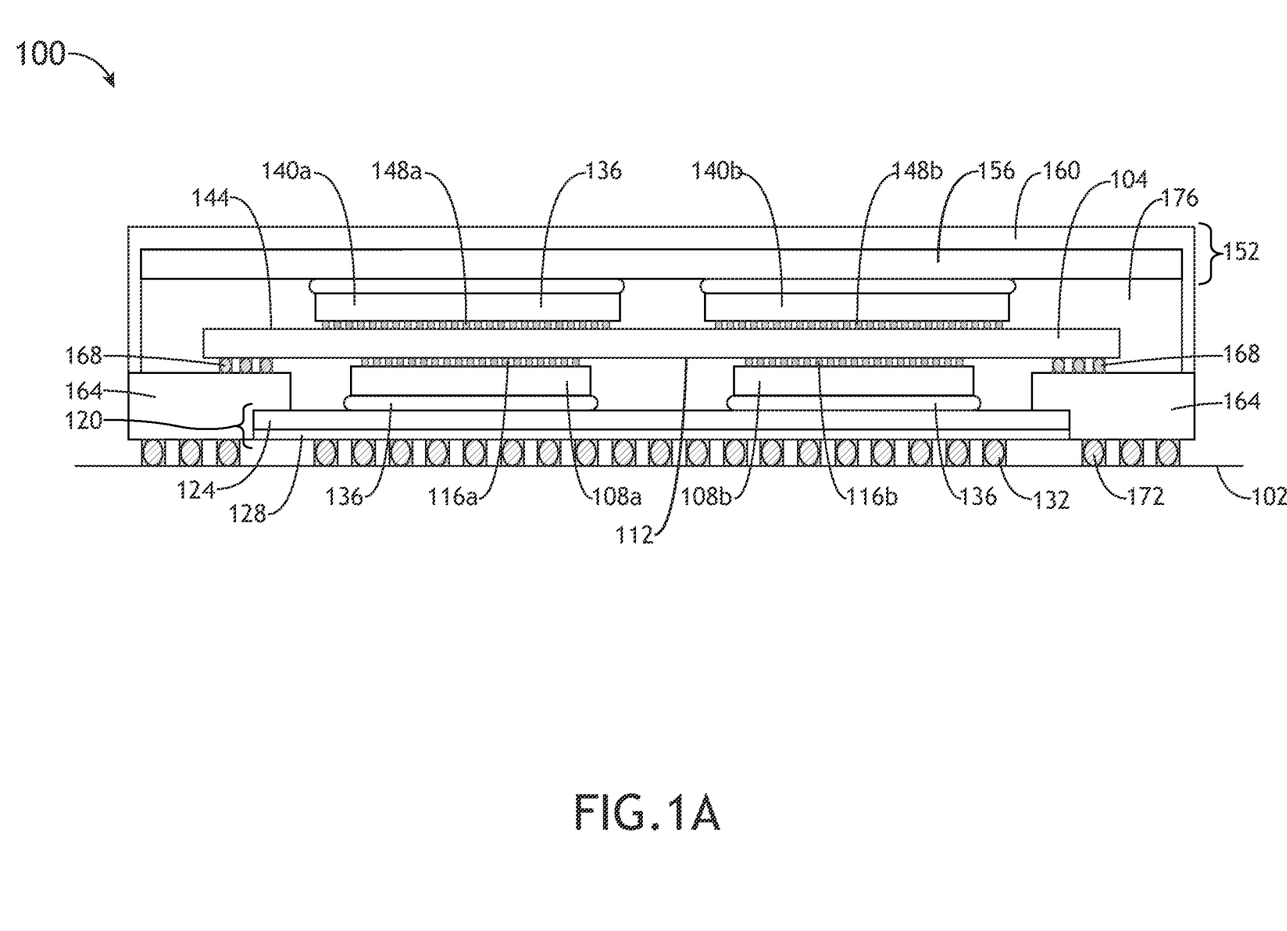
FIG. 1A-C are diagrams illustrating a cross-sectional view of a semiconductor package system, in accordance with one or more embodiments of this disclosure.
Figure 1B:
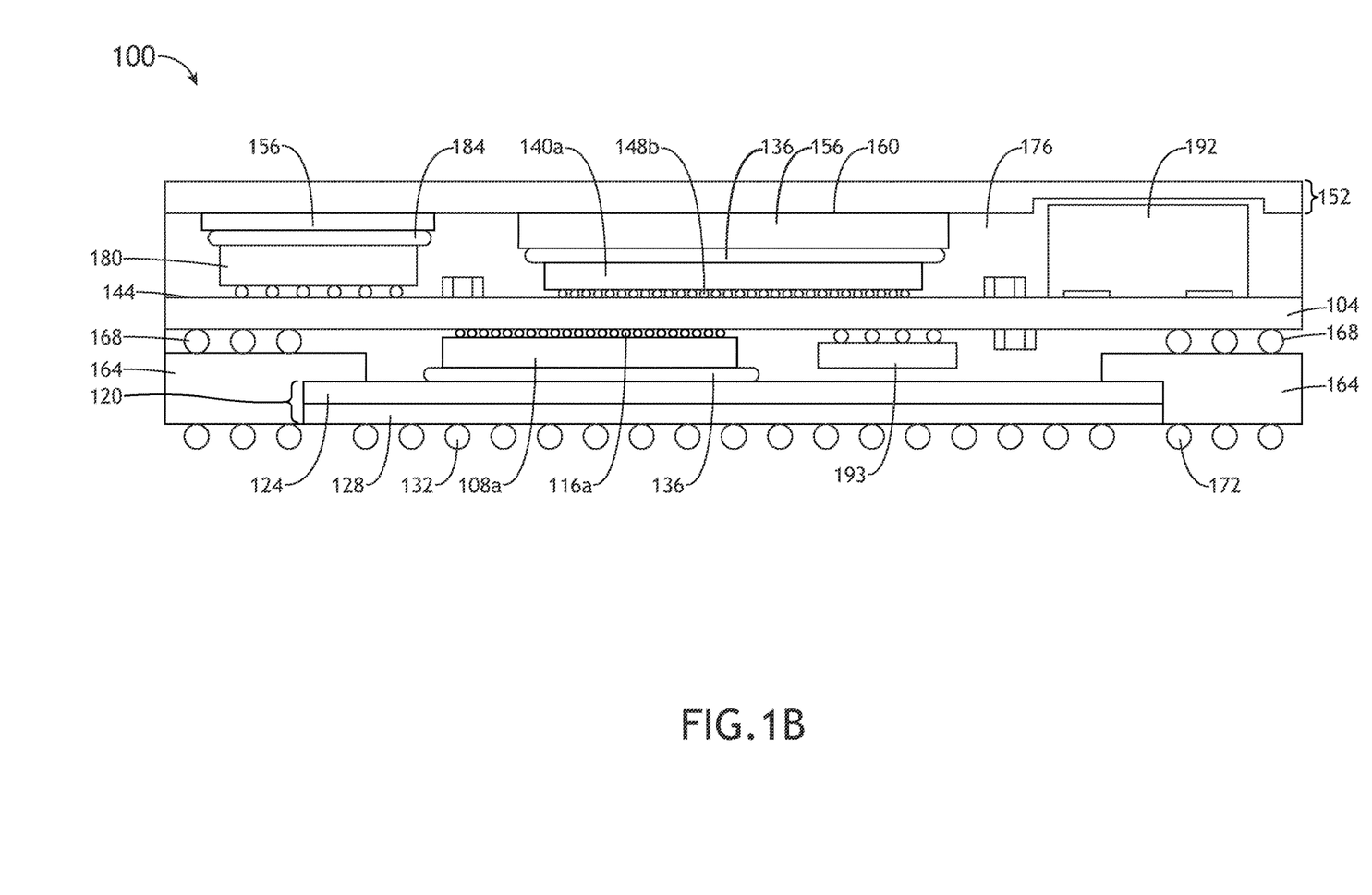
Figure 1C:
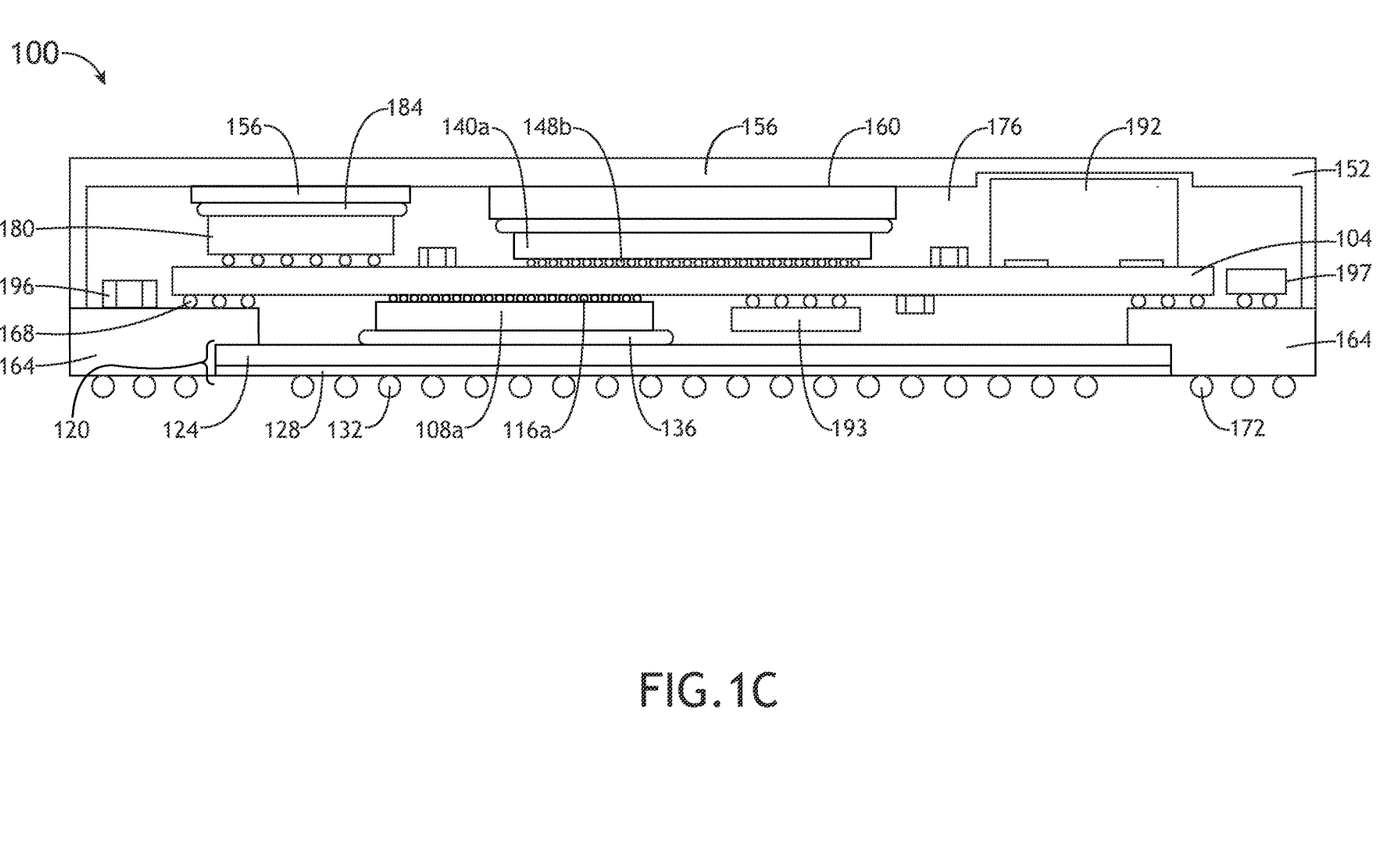

FIG. 1A-1C illustrate a cross-sectional view of a semiconductor package system 100, in accordance with one or more embodiments of this disclosure. The semiconductor package system 100 may comprise any type of integrated circuit packaging types including but not limited to through-hole packages, chip carriers, pin grid arrays, flat packages, small outline packages, chip-scale packages, and ball grid arrays (BGAs) For example, the semiconductor package system may comprise a BGA-type package, wherein bumps of solder are used to connect componentry of the semiconductor package system 100 to a package substrate 102, such as PCBs and PWBs.

Semiconductor package systems 100 that use area array packages comprise any array packaging known including but not limited to fine-pitch ball-grid array (FBGA), low-profile ball-grid array (LBGA), ceramic ball-grid array (CBGA), land grid array (LGA), and organic ball-grid array (OBGA). For example, the semiconductor package system 100 may comprise a LBGA.

In some embodiments, the semiconductor package system 100 includes a first interposer 104 providing an electrical interface between one or more components of the semiconductor package system 100. The first interposer 104 may be constructed of any material known in the art. For example, the first interposer 104 may be constructed from a rigid glass-reinforced epoxy laminate material, such as FR-4. In another example, the first interposer 104 may be constructed from flexible polyimide material. Interposers may take the form of any known componentry. For example, the first interposer 104 may comprise a high-density circuit board. In another example, the first interposer 104 may comprise a semiconductor die. The first interposer 104 may be of any size or area. For example, the first interposer 104 may have an area larger than a semiconductor chip. The semiconductor package system 100 may also comprise multiple first interposers.

In some embodiments, the semiconductor package system 100 comprises a first integrated circuit die 108*a*, 108*b* electrically coupled and thermally coupled to a first side 112 of the first interposer 104. The first integrated circuit die 108*a*, 108*b* may comprise any type of semiconductor chip including but not limited to a memory chip, a central processing unit (CPU), a graphical processing unit (GPU), an analog chip, an application-specific integrated circuit (ASIC), or a field programable gate array (FPGA). The first side 112 of the first interposer 104 may be coupled to any number and/or type of first integrated circuit die 108*a*, 108*b*. For example, the first side 112 of the first interposer 104 may be coupled to two memory chips and an FPGA.

The first integrated circuit die 108*a*, 108*b* may be coupled to the first side 112 of the first interposer 104 via any method known including but not limited to bonding wires or solder bumps. For example, the first integrated circuit die 108*a*, 108*b* may be coupled to the first side 112 of the first interposer 104 via a first solder ball array 116*a*, 116*b* (e.g., similar to flip chips.)

In some embodiments, the semiconductor package system 100 comprises a base thermal spreader 120 coupled to the first integrated circuit die 108*a*, 108*b* configured to conduct heat away from the first integrated circuit die 108*a*, 108*b* to the package substrate 102 (e.g., heat transfers to the PCB). The base thermal spreader 120 may be composed of a single layer or composed of multiple layers. For example, the base thermal spreader 120 may comprise a base thermal layer 124 and a base lid 128. The base thermal spreader 120 may be thermally coupled to a package substrate 102 via any method known including but not limited to solder bumps, thermal adhesive, thermal tape, thermal grease, or solder or solder-like compounds. For example, the base thermal spreader 120 may be thermally coupled to a circuit board via base solder bumps 132. In another example, the base thermal spreader 120 may be thermally coupled to a circuit board via a thermal interface material such as grease.

The first integrated circuit die 108*a*, 108*b* may be coupled to the base thermal spreader 120 via a thermal interface 136, which provides a low thermal resistance contact between the first integrated circuit die 108*a*, 108*b* and the base thermal spreader 120. The thermal interface 136 may comprise any material or substance known including but not limited to thermal paste, thermal adhesive, thermal gap filler, a thermally conductive pad, thermal tape, phase-change materials, or metal thermal interface materials. For example, the thermal interface 136 may comprise a silicone thermally conductive pad.

In some embodiments, the semiconductor package system 100 comprises a second integrated circuit die 140*a*, 140*b* electrically coupled and thermally coupled to a second side 144 of the first interposer 104. The second integrated circuit die 140*a*, 140*b*, may comprise any type of semiconductor chip including but not limited to a memory chip, a CPU, a GPU, an ASIC, or an FPGA. The second side 144 of the first interposer 104 may be coupled to any number or type of second integrated circuit die 140*a*, 140*b*. For example, the second side 144 of the second interposer may be coupled to three ASICs and a CPU.

The second integrated circuit die 140*a*, 140*b* may be coupled to the second side 144 of the first interposer 104 via any method known including but not limited to bonding wires or solder bumps. For example, the second integrated circuit die 140*a*, 140*b*, may be coupled to a second side 144 of the first interposer 104 via a second solder ball array 148*a*, 148*b*.

In some embodiments, the semiconductor package system 100 comprises a top thermal spreader 152 thermally coupled to the second integrated circuit die 140*a*, 140*b* configured to conduct heat away from the second integrated circuit die 140*a*, 104*b*. The top thermal spreader 152 may be composed of a single layer or composed of multiple layers. For example, the top thermal spreader 152 may comprise a top thermal layer 156 and a top lid 160. The top lid 160 may be configured as a housing that extends over the sides of the semiconductor package system 100, with the top thermal layer 150 lining the inside surface of the top lid 160, or a portion of the inside surface of the top lid 160. The second integrated circuit die 140*a*, 140*b* may be coupled to the top thermal spreader 152 via a thermal interface 136 as described above.

In some embodiments, the top thermal spreader 152 is configured to attach to an external heat removal module. The external heat removal module may include any type of heat removal structure including but not limited to a finned heat sink, a heat pipe, or a liquid cold plate. For example, the top lid 160 of the top thermal spreader 152 may be thermally coupled to a finned heat sink.

The base lid 128 and/or the top lid 160 may comprise a composite assembly of two or more materials that exhibit thermal characteristics, expansion characteristics, electrical characteristics, optical characteristics, and/or structural characteristics that would not be otherwise achieve with a single material. This composite assembly may involve mechanical attachment of the two or more materials to each other.

The base lid 128 and/or the top lid 160 may be comprised of materials that provide a thermal path between internal components of the semiconductor package system 100 and the external components of the semiconductor package system 100. The base lid 128 and/or the top lid 160 may also be comprised of materials that reduce electromagnetic interactions between the internal components of the semiconductor package system 100 and the external components of the semiconductor package system 100 through electromagnetic shielding, and/or absorption or reflection of electromagnetic energy. The base lid 128 and/or the top lid 160 may also be comprised of materials that reduce the level of external radiation that enters the semiconductor package system 100 to prevent single-event effects, such as single-event upsets.

In some embodiments, the semiconductor package system 100 comprises a ring carrier 164. The ring carrier 164 provides a physical support for the semiconductor package system 100 and is configured to mechanically couple the semiconductor package system 100 to the package substrate 102. The ring carrier 164 may also be configured to conduct heat from the semiconductor package system 100 to the package substrate 102. The ring carrier 164 may also be electrically coupled to the package substrate and other componentry of the semiconductor package system 100. For example, the ring carrier may relay electric input and output signals from the first integrated circuit die 108a, 108b and the second integrated circuit die 140a, 140b to the package substrate 102, while providing a direct thermal path for the second integrated circuit die 140a, 140b (e.g., the ring carrier 164 is configured with internal wiring that can transmit input signals and output signals between the first interposer 104 and the package substrate 102). The ring carrier may be formed of any material known capable of providing thermal transfer and the propagation of electric signals from the first interposer 104 to the package substrate.

In some embodiments, the ring carrier 164 is electrically coupled to the first interposer 104. For example, the ring carrier may be configured to receive electric signals (e.g., input/output signals) from the first interposer 104 that originated from the first integrated circuit die 108a. 108b, and/or the second integrated circuit die 140a, 140b, and relay the electric signals to the package substrate. The ring carrier 164 may be electrically coupled to the first interposer 104 via any method known including wire bonding or solder bumps. For example, the ring carrier 164 may be electrically coupled to the first interposer 104 via interposer-coupling solder bumps 168. In embodiments, the ring carrier 164 is thermally coupled to the first interposer 104 via the electrically coupled components (e.g., the interposer-coupling solder bumps 168) or other thermally coupling materials and substances. For example, the ring carrier 164 and the first interposer 104 may be thermally coupled via an underfill material. In this semiconductor package system 100, there is less need to stack interposers on top of each other using die thinning and large solder bumps to generate needed clearances. The high circuit density of the first interposer 104 provides all internal connectivity between each die, leaving only the host (e.g., package substrate 102) input/output signals to be transmitted through the ring carrier 164, which has a larger pitch. The stepped ring in the semiconductor package system 100 also accommodates componentry where the z-height of the die is greater than the interposer to carrier bump height.

The ring carrier 164 may be electrically coupled to the package substrate 102 by any method known including but not limited to solder bumps, through hole pins and compliant package leads. For example, the ring carrier 164 may be electrically coupled to the package substrate via substrate solder bumps 172. The substrate solder bumps 172 may also provide thermal coupling and/or mechanical coupling of the ring carrier 164 to the package substrate 102. Thermal coupling from the ring carrier 164 to the package substrate 102 may be provided by the electrical coupling components (e.g., the substrate soldier bumps 172) or other thermally coupling materials and substances. For example, the ring carrier 164 and the package substrate 102 may be thermally coupled via an underfill material.

In some embodiments, the ring carrier 164 is thermally coupled to the top thermal spreader 152. For example, one or more overhanging sides of the top lid 160 of the top thermal spreader 152 may contact the top portion of the ring carrier 164, allowing efficient transfer of heat.

In some embodiments, the ring carrier 164 is thermally coupled to the base thermal spreader 120. For example, the ring carrier 164 may be configured with a recess where the base thermal spreader 120 may be partially inserted, allowing efficient transfer of heat.

The structure of the ring carrier 164 and the coupling of the ring carrier 164 to the first interposer 104 increases the clearance for components attached to the first side 112 of the first interposer 104. This positioning also results in the formation of multiple cavities 176 within the semiconductor package system 100 that can be used for attachment of other electronic componentry or for the addition of heat transferring material, such as thermal paste.

The semiconductor package system 100 may include multiple combinations, componentry sizes (e.g., componentry heights), and types of electronic componentry. For example, FIG. 1B illustrates a semiconductor package system 100 that includes a third integrated circuit die 180 and third thermal interface 184 that differs in thickness from the second integrated circuit die 140a, with the top thermal layer 156 segmented, or skylined, into layers of differing thickness, allowing both a third thermal interface 184, as well as the thermal interface 136 of the second integrated die 140a to contact the top thermal layer 156 and create a thermal path to the top thermal spreader 152. The semiconductor package system 100 may also include thermally unlinked integrated circuits 193. In some embodiments, the ring carrier 164 may be mechanically coupled and/or electrically coupled directly to other electronic componentry 196, 197 within the semiconductor package system (e.g., as in FIG. 1C).

Figure 1D:
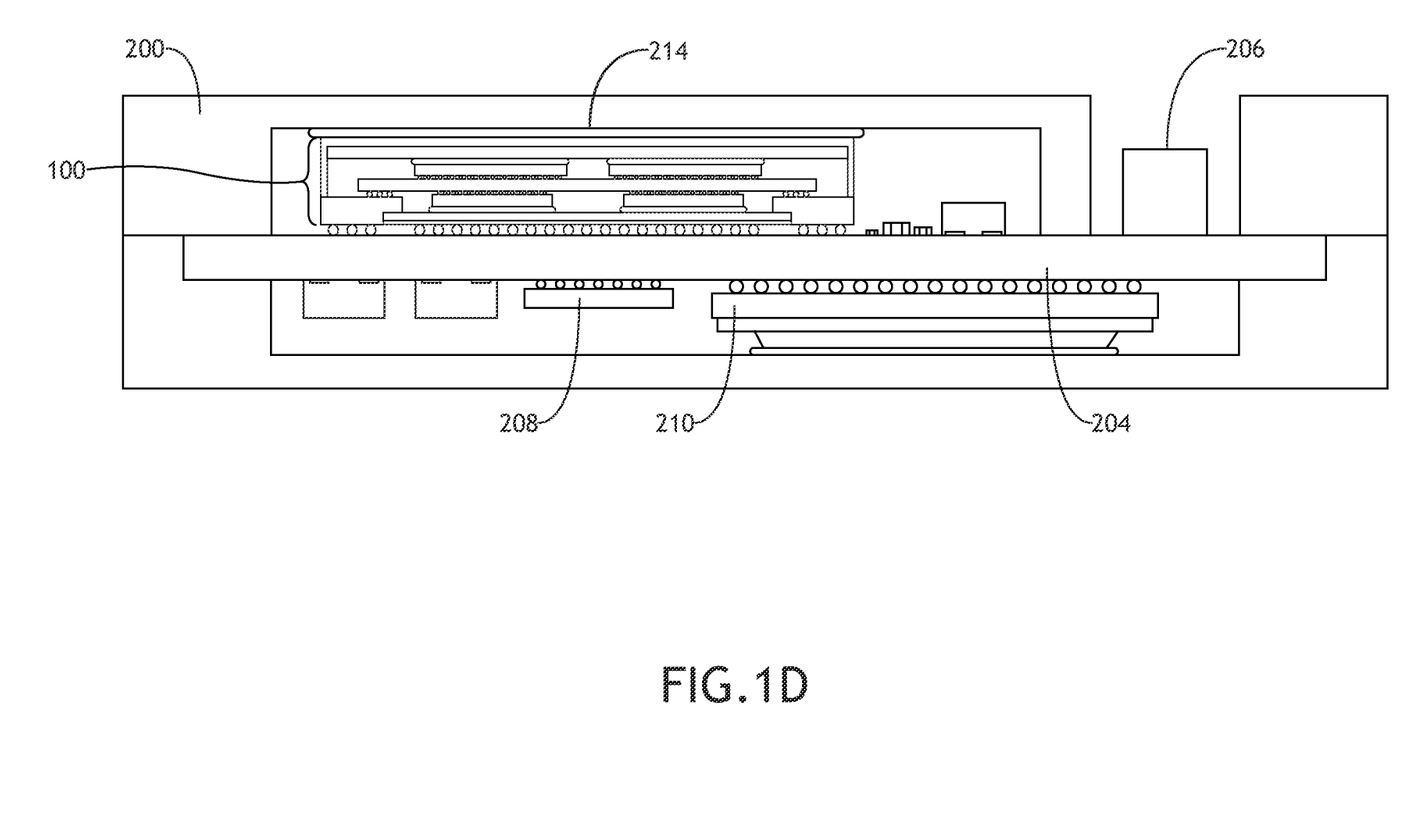
FIG. 1D is a diagram illustrating a cross-sectional view of a semiconductor package system coupled to a host circuit card assembly within a chassis, in accordance with one or more embodiments of the disclosure.

FIG. 1D illustrates a semiconductor package system 100 enclosed within a chassis 200, in accordance with one or more embodiments of the disclosure. The semiconductor package system 100 may be mechanically coupled and electrically coupled to a host circuit card assembly 204 that is itself mechanically coupled to the chassis 200. The semiconductor package system 100 also may include a chassis interface material 214 configured to couple the semiconductor package system 100 to the chassis 200 and distribute heat to the chassis 200. The chassis 200 may further include other electronic componentry (e.g., connectors 206, and processors 208, 210).

It is to be understood that many combinations of materials and substances used for electrically coupling, thermally coupling, and mechanically coupling (e.g., physically coupling) componentry within the semiconductor package system 100 are possible and that some materials and substances may be used for more than one purpose. For example, solder bumps may be used for electrically coupling, thermally coupling, and mechanically coupling two components of the semiconductor package system 100. Therefore, the above description should not be interpreted as a limitation of the present disclosure, but merely an illustration.

Figure 2:
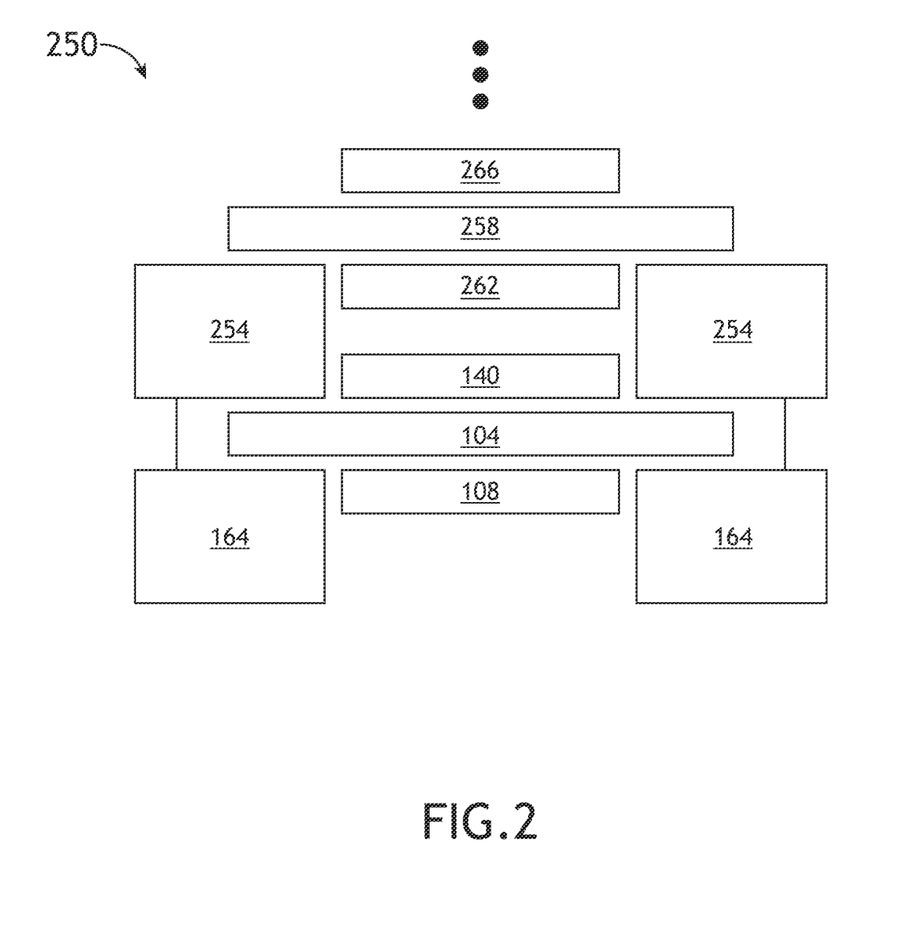
FIG. 2 is a block diagram illustrating the electrically coupled components of a stacked semiconductor package system, in accordance with one or more embodiments of the disclosure.

FIG. 2 illustrates the electrically coupled components of a stacked semiconductor package system 250, in accordance with one or more embodiments of the disclosure. The ring carrier 164 supports and is electrically coupled and thermally coupled to the first interposer 104, which supports and is electrically coupled and thermally coupled to the first integrated circuit die 108 and the second integrated circuit die 140. The stacked semiconductor package system 250 may further include stack ring carrier 254. The stack ring carrier 254 may be electrically coupled, thermally coupled, and/or mechanically coupled to the ring carrier 164. The stack ring carrier 254 may also be implemented as an extension of the ring carrier 164.

In some embodiments, the stacked semiconductor package system 250, further includes a second interposer 258 electrically coupled, thermally coupled, and/or mechanically coupled to the ring carrier. The second interposer 258 is electrically coupled and thermally coupled to a third integrated circuit die 262 and a fourth integrated circuit die 266, each disposed on opposite sides of the second interposer 258. In this manner, multiple layers of die within the stacked semiconductor package system 250 may be formed, with electric signals, as well as heat, directed through the ring carrier 164 and stacked ring carriers 254.

Figure 3:
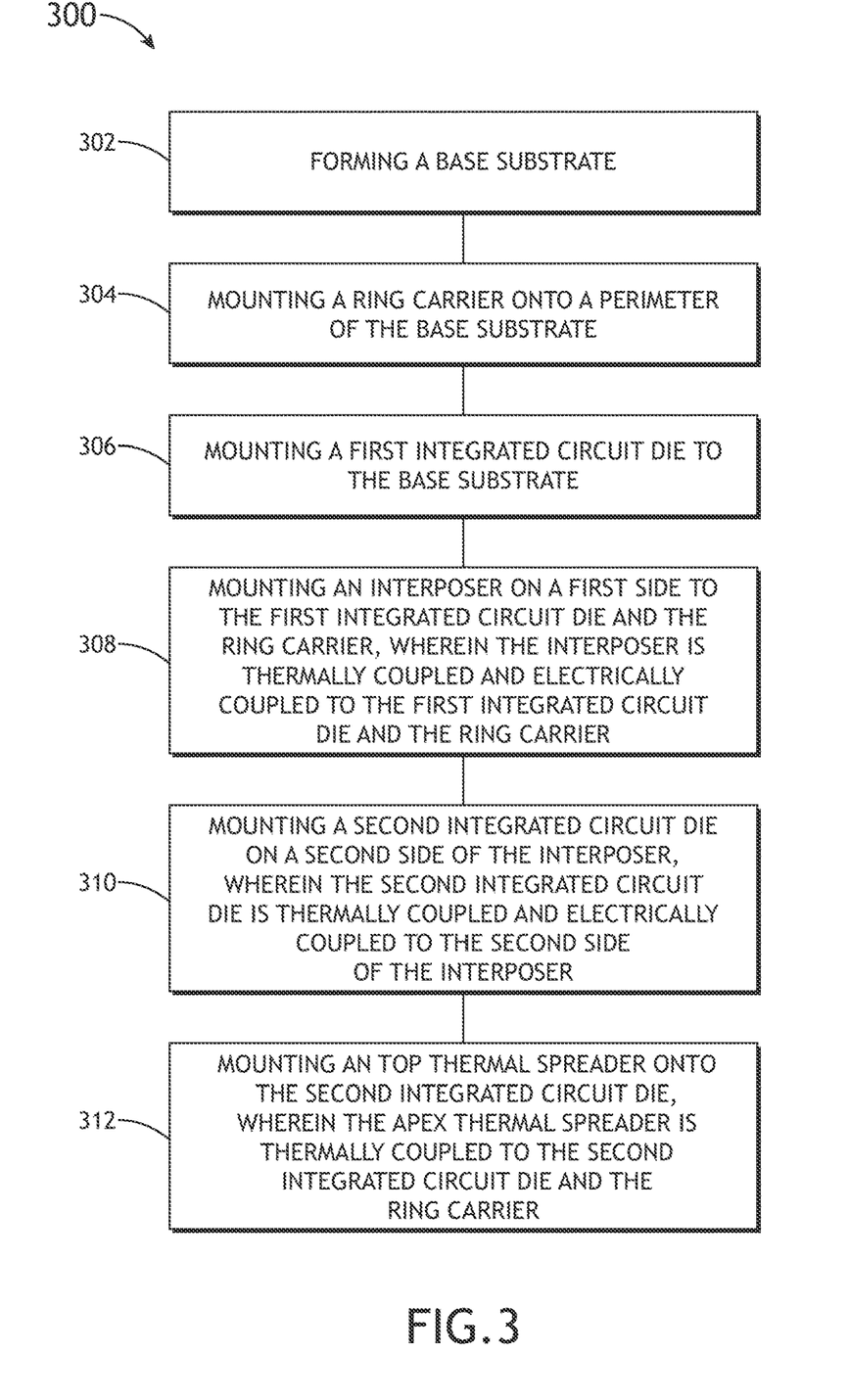
FIG. 3 illustrates a flowchart for a method of manufacturing a semiconductor package system 100, in accordance with one or more embodiments of this disclosure.

FIG. 3 illustrates a flowchart for a method 300 of manufacturing a semiconductor package system 100, in accordance with one or more embodiments of this disclosure. In some embodiments, the method 300 includes a step 302 of forming a base substrate. The base substrate may comprise the base thermal spreader 120 or other component of the semiconductor package system 100 (e.g., the base substrate may comprise the package substrate 102). The base thermal spreader 120 itself be attached to a package substrate via base solder bumps 132 or other attachment mechanism.

In some embodiments, the method 300 includes a step 304 of mounting a ring carrier 164 onto a perimeter of the base substrate. For example, the ring carrier 164 may be configured with a recess that increases the contact between the ring carrier 164 and the base substrate. The ring carrier 164 may be placed up against the base substrate, or may be physically coupled and/or thermally coupled to the base substrate via adhesives, solder beads, thermal grease, or other material. The ring carrier 164 itself may also be attached to the package substrate via substrate solder bumps 172 or other mechanism, In some embodiments, the method 300 includes a step 306 of mounting a first integrated circuit die 108 to the base substrate. Alternatively, the first integrated circuit die 108 may be mounted to the first interposer 104.

In some embodiments, the method 300 includes a step 308 of mounting a first interposer 104 one a first side 112 of the first integrated circuit die 108 and the ring carrier 164, wherein the first interposer 104 is thermally coupled and electrically coupled to the first integrated circuit die 108 and the ring carrier 164. One or more components of the semiconductor package system 100 may be mounted onto the first interposer 104 (e.g., such as the first integrated circuit die 108) before the first interposer 104 is itself mounted.

In some embodiments, the method 300 includes a step 310 of mounting a second integrated circuit die 140 on a second side 144 of the first interposer 104, wherein the second integrated circuit die is thermally coupled and electrically coupled to the second side of the first interposer 104. The second integrated circuit die 140 may also be mounted onto the first interposer 104 before the first interposer 104 is itself mounted.

In some embodiments, the method 300 includes a step 312 of mounting a top thermal spreader 120 onto the second integrated circuit die 140, wherein the top thermal spreader 120 is thermally coupled to the second integrated circuit die 140 and the ring carrier 164. The top thermal spreader 152 may a single layered or multi-layered entity. For example, the top thermal spreader 152 may include a top thermal layer 156 and a top lid 160. The method 300 may further include a step of adding a thermal interface 136. For example, the thermal interface 136 may be added between the first integrated circuit die and the base thermal spreader. In another example, the thermal interface 136 may be added between the second integrated circuit die and the top thermal spreader.

In some embodiments, the top thermal layer 156 and/or the base thermal layer 124 may include materials that provide safety, stability and/or usability benefits for the semiconductor package system 100 that include, but are not limited to, electromagnetic shielding material, thermal conductivity material, thermal expansion material optically transparent material, polymorphic material or any materials having a mechanical characteristic and/or optical characteristic (e.g., materials that have electromagnetic shielding properties, thermal conductivity properties, thermal expansion properties and/or optically transparent properties). For example, the electromagnetic shielding material may include any material capable of electromagnetic shielding ranging from 20 to 120 dB. For instance, the electromagnetic shielding material may have a shielding capability of approximately 80 dB. In another example, the thermal conductivity material may include any material capable of thermal conduction ranging from 1 to 2000 W/mK. For instance, the thermal conduction material may be configured with a thermal conduction value of approximately 300 W/mK. In another example, the thermal expansion material may have a coefficient of thermal expansion ranging from 1.5 to 100 ppm/° C. For instance, the thermal expansion material may have a coefficient of thermal expansion of approximately 20 ppm/° C.

In some embodiments, the top thermal layer 156 and/or the base thermal layer 124 may include two or more spreader layers (e.g., the top thermal layer 156 and/or the base thermal layer 124 are themselves formed of separate layers), with a least one layer (e.g., a first spreader layer) including materials that provide safety, stability and/or usability benefits for the semiconductor package system 100 that include, but are not limited to, electromagnetic shielding material, thermal conductivity material, thermal expansion material, polymorphic material or any materials having a mechanical characteristic (e.g., resistance to stress) and/or an optical characteristic (e.g., resistance to UV light).

In some embodiments, one of the two or more spreader layers (e.g., a second spreader layer) may include materials that include, but are not limited to, electromagnetic shielding material, thermal conductivity material, thermal expansion material, polymorphic material or any materials having a mechanical characteristic and/or an optical characteristic. The first spreader layer and the second spreader layer may be formed from different materials that, when the layers are combined, give the top thermal layer 156 and/or the base thermal layer 124 different characteristics (e.g., substantially different characteristics) than could be obtained from a single layer made of a single material. For example, the top thermal layer 156 may be formed of a first spreader layer that includes highly thermally conducting, but low electromagnetically shielding, material and a second spreader layer that includes high electromagnetically shielding, but low thermally conducting, material so that the top thermal layer will have both moderate to high thermally conducting and electromagnetically shielding characteristics. Any combination of spreader layers, each having various characteristics are possible, giving the top thermal layer 156 and/or the base thermal layer 124 any combination of characteristics, whether they are electromagnetic shielding characteristics, thermal conductivity characteristics, thermal expansion characteristics, mechanical characteristics, or optical characteristics. The term 'substantially different' may include a pair of values having a difference greater that two-fold. For example, a thermal conduction value of 30 W/mK versus a thermal conduction value of 75 W/mK (i.e., a 2.5-fold difference). In another example, "substantially different" may include differences greater than 10-fold. In another example, "substantially different" may include differences greater than 100-fold.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried out in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A semiconductor package system comprising:
   a base lid comprising electromagnetic shielding material;
   a first interposer;
   a first integrated circuit die electrically coupled and thermally coupled to a first side of the first interposer;
   a second integrated circuit die electrically coupled and thermally coupled to a second side of the first interposer;
   a ring carrier electrically coupled to the first interposer, wherein the ring carrier is configured to transmit an input to the first interposer;
   a first thermal spreader coupled to the ring carrier, to the first integrated circuit, and to the base lid;
   a top lid comprising electromagnetic shielding material; and
   a second thermal spreader coupled to the top lid.

2. The system of claim 1, further comprising a package substrate electrically coupled to the ring carrier.

3. The system of claim 1, further comprising a second interposer electrically coupled and thermally coupled to the ring carrier.

4. The system of claim 1, further comprising a thermal interface disposed between the thermal spreader and at least one of the first integrated circuit or the second integrated circuit.

5. The system of claim 1, wherein the thermal spreader comprises at least one of an electromagnetic shielding material, an electromagnetic shielding property, a thermally conductive material, a thermally conductive property, an optically transparent material, an optically transparent property, a thermal expansion material, a thermal expansion property, or a polymorphic material.

6. The system of claim 1, wherein the thermal spreader is comprised of at least two spreader layers, wherein a first spreader layer of the thermal spreader comprises at least one of an electromagnetic shielding material, a thermally conductive material, a thermal expansion material, or a polymorphic material, wherein the thermal spreader comprises at least one of an electromagnetic shielding characteristic, a thermally conductive characteristic, an optically transparent material, a thermal expansion characteristic, a mechanical characteristic, or an optical characteristic that is substantially different than at least one of the electromagnetic shielding characteristic, the thermally conductive characteristic, the thermal expansion characteristic, the mechanical characteristic, or the optical characteristic of the first spreader layer.

7. The system of claim 1, further comprising an external heat removal module thermally coupled to the thermal spreader.

8. The system of claim 1, wherein a position of the ring carrier creates one or more cavities within the system that provide at least one of clearance for components on the first surface or the second surface of the interposer or the thermal spreader.

9. A method for manufacturing a semiconductor package comprising:
   forming a base substrate;
   mounting a base lid to the base substrate, wherein the base lid comprises electromagnetic shielding material;
   mounting a ring carrier onto a perimeter of the base substrate;
   mounting a first integrated circuit die to the base lid;
   mounting an interposer on a first side to the first integrated circuit die and the ring carrier, wherein the interposer is thermally coupled and electrically coupled to the first integrated circuit die and the ring carrier;
   mounting a second integrated circuit die on a second side of the interposer, wherein the second integrated circuit die is thermally coupled and electrically coupled to the second side of the interposer;
   mounting a top thermal spreader onto the second integrated circuit die, wherein the top thermal spreader is thermally coupled to the second integrated circuit die and the ring carrier; and
   mounting a top lid to the top thermal spreader, wherein the top lid comprises electromagnetic shielding material.

10. The method of claim 9, wherein the base substrate comprises a base thermal spreader.

11. The method of claim 10, further comprising adding a thermal interface between the first integrated circuit die and the base thermal spreader.

12. The method of claim 10, wherein at least one of the top thermal spreader or the base thermal spreader comprises a thermal layer and a lid.

* * * * *